Sept. 25, 1962

J. A. BOURGET 3,056,064

TRANSISTOR SWITCH

Filed April 8, 1958

Inventor
Joseph Andre Bourget
Schroeder, Hofgren,
Brady & Wegner
Attorneys 3,056,064

TRANSISTOR SWITCH

Joseph Andre Bourget, Chicago, Ill., assignor to Warwick Manufacturing Corporation, a corporation of Delaware Filed Apr. 8, 1958, Ser. No. 727,223

7 Claims. (Cl. 315—27)

This invention relates to a switching circuit and more particularly to a novel transistor switching circuit.

Transistor devices are widely used as switching elements in various types of circuits. Low power applications include counters, computers and the like. The development of transistors capable of handling large currents has led to their use as switching elements in high power situations, as deflection circuits and high voltage power supplies, for example. Particularly in high power circuits where the switching transistor may handle a current of several amperes, it has been found that the current flow through the transistor cannot be cut off rapidly when the switch is opened. Apparently, this is due to the presence of stored carriers in the base portion of the transistor.

It is the principal object of this invention to provide a transistor switching circuit in which the stored carriers are drained rapidly from the switching transistor when the switch is opened.

More particularly, an object of the invention is the provision of a transistor switch circuit comprising a switching transistor having a load connected thereto, a source of switching signal connected to the transistor for rendering it alternately conductive and nonconductive, and means connected to the transistor for draining the stored carriers therefrom during the nonconductive portion of the cycle.

Another object of the invention is to provide a circuit in which a second transistor is connected to the source of switching signal and to the switching transistor and is rendered operative by the switching signal, draining the stored carriers from the base of the switching transistor during the nonconductive portions of the switching transistor cycle.

Yet another object of the invention is a provision of a circuit including a switching transistor having a load connected thereto, a driving transistor, a third transistor, a source of switching signal, and a circuit connecting the driving and third transistor with the source of switching signal for rendering them alternately, periodically conductive, the switching transistor conducting periodically and synchronized with the driving transistor, and the third transistor draining stored carriers from the switching transistor during the nonconducting portion of its cycle.

Further objects and advantages will become apparent from the following detailed description taken in connection with the accompanying drawings, in which:

FIGURE 1 is a schematic drawing of a basic transistor switch circuit;

FIGURE 1*a* is a representation of a current wave form in the circuit of FIGURE 1;

Figures 1, 1A, 2:
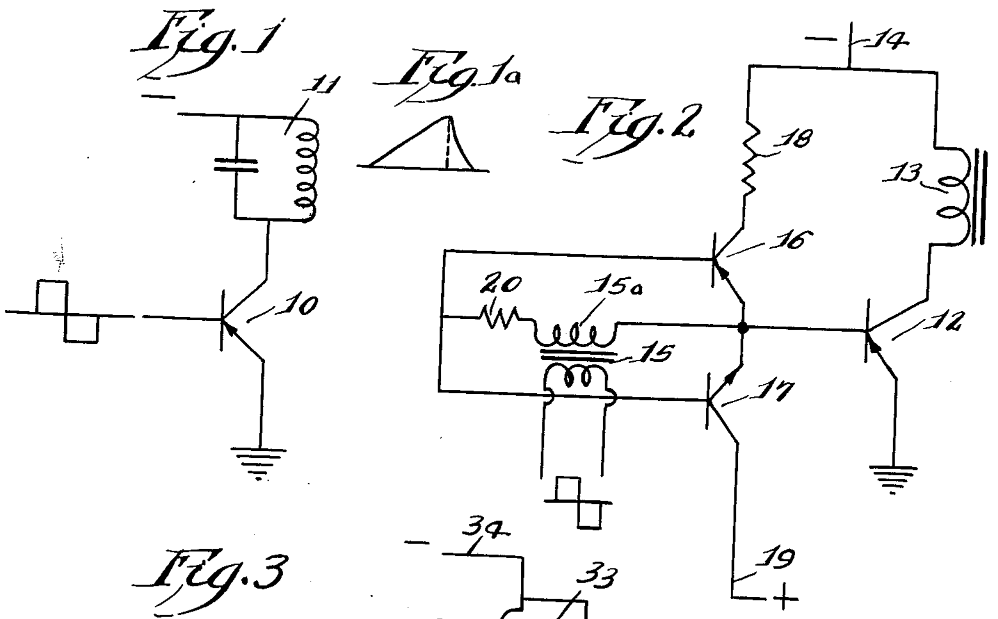
FIGURE 2 is a schematic diagram of an embodiment of the invention.

While this invention is susceptible of embodiments in many different forms, there is shown in the drawings and will herein be described in detail an embodiment of the invention with the understanding that the present disclosure is to be considered as an exemplification of the principles of the inventiton and is not intended to limit the invention to the embodiment illustrated. The scope of the invention will be pointed out in the appended claims.

In FIGURE 1, a PNP transistor is illustrated connected in a grounded emitter switching circuit, with a load 11 connected to the collector thereof. A switching control signal, here illustrated as a square wave, is applied to the base, rendering the transistor alternately nonconductive and conductive, on the positive and negative portions of the signal, respectively. FIGURE 1*a* illustrates the collector current wave form in a high power circuit of this nature. When the transistor 10 is switched off by the control signal, the current is not interrupted instantaneously along the broken line of the wave form, as would be desirable, but rather decreases exponentially as shown by the solid line portion of the curve. This characteristic is a result of stored carriers present in the base portion of the transistor with high current flow, and makes it impractical to use such a circuit in a situation where it is necessary that the current be cut off rapidly, as in the deflection circuit of a television receiver.

Turning now to FIGURE 2, a circuit is shown which provides a means for drawing off the carriers from the base of a switching transistor when the switching transistor is cut off. In describing the circuit, values and type designations will be assigned to various elements. It is to be understood that these values and types are given solely for the purpose of making a complete disclosure of an operative circuit and are not to be construed as essential, as many changes and modifications will be apparent to those skilled in the art.

A PNP switching transistor 12, 2N296, is connected for grounded emitter operation with the collector connected through a load 13 to a source of negative potential 14. A switching control signal, which may be a square wave or a sine wave, is coupled through the transformer 15 to a control circuit including a PNP driver transistor 16, 2N291 and an NPN transistor 17, 2N35. The emitters of transistors 16 and 17 are connected together and to the base of the switching transistor 12. The collector of driver transistor 16 is connected through current limiting resistor 18, 100 ohms, to negative potential supply 14; while the collector of transistor 17 is connected to positive potential 19. The secondary winding 15*a* of control signal input transformer 15 has one terminal connected to the emitters of transistors 16 and 17 and another terminal connected through limiting resistor 20, 22 ohms, to the base terminals of the two transistors. As will appear in more detail below, the transistor 17 is rendered conductive when the switching transistor 12 is cut off so that the stored carriers, principally in the base of the switching transistor, are dissipated rapidly and affect the collector current for a minimum time. While any effect of the carriers on collector current is undesirable, the described circuit minimizes this effect.

With an appropriate signal, as a square or sine wave, applied to the primary winding of transformer 15, driver transistor 16 and NPN transistor 17 are periodically and alternately rendered conductive. The driver transistor in turn provides a control signal to the switching transistor which conducts periodically and in synchronism with the conduction of the driver transistor. For example, with the circuit shown, when the left-hand terminal of secondary winding 15*a* is negative with respect to the right-hand terminal, the driver transistor 16 and switching transistor 12 conduct. When the signal polarity is reversed, these two transistors are cut off and transistor 17 conducts. Resistor 20 limits the amplitude of the control signal current and equalizes the drive to the control transistors 16 and 17.

Because of the rapid cut off characteristic of the switching circuit, the switching speed may be increased over that obtainable with the circuit of the type shown in FIGURE 1 by a factor of up to 150. In addition, the Zener limit, or inverse breakdown voltage of the switching transistor, is increased equal to the base-collector limit (with emitter open).

Figure 3:
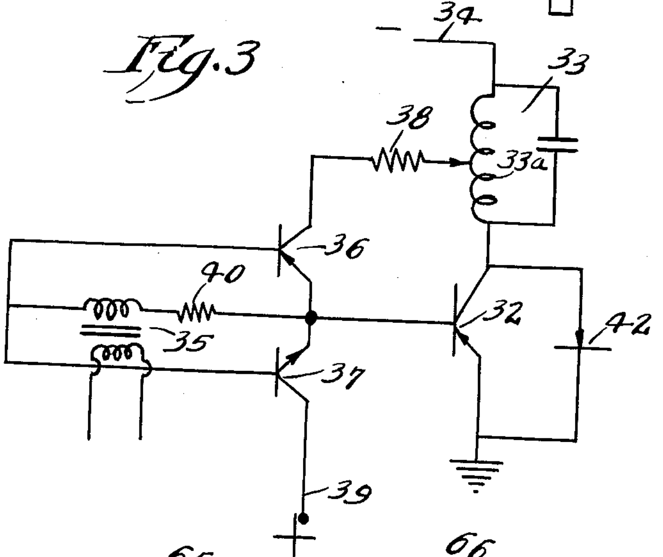
FIGURE 3 is a schematic diagram of another embodiment of the invention.

Turning now to the embodiment of the invention illustrated in FIGURE 3, reference numerals 20 higher than those used in FIGURE 2 are employed to indicate like elements. The switching transistor 32 is again connected for grounded emitter operation with the load 33, here shown as tuned L-C circuit connected between the collector and source 34 of negative potential. The switching control signal is coupled to the control circuit transformer 35 connected with driver transistor 36 and transistor 37 which provides a stored carrier drain for the switch transistor. Limiting resistor 40 equalizes the drive to control transistors 36 and 37.

In the circuit of FIGURE 2, the current drawn by transistor 16 passes through a dropping resistor 18 to the supply. This results in substantial power loss, reducing the over-all efficiency of the system. In FIGURE 3, the collector circuit of transistor 36 is connected through resistor 38, 10 ohms, to a tap on the inductor 33a of the switching transistor load, so that the driver current passes through a portion of the load and thus contributes to the useful output of the circuit. With connection of the collector of the driver transistor at the proper impedance level of the switching transistor load, the resistance (38) in the collector circuit may be reduced to zero. However, in order that transistors having slightly different characteristics may be used in the circuit without introducing a mismatch, it is desirable to have the small amount of resistive loading provided by resistor 38.

A diode 42 is shunted across switching transistor 32 as a damper where the load, as a deflection yoke, permits its use.

Figure 4:
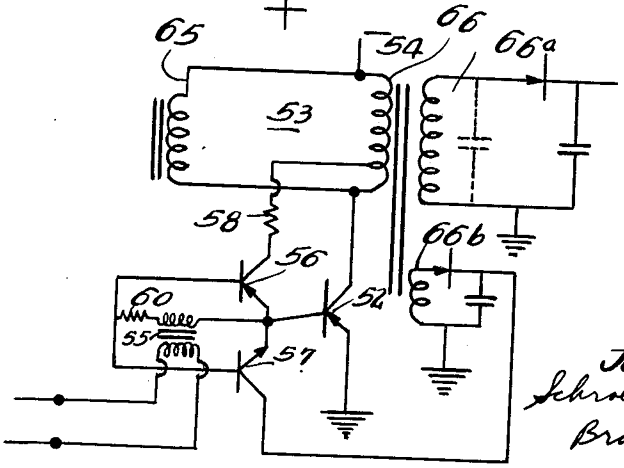
FIGURE 4 is a schematic diagram of a further embodiment of the invention.

Another embodiment of the invention is illustrated in FIGURE 4 where reference numerals 40 higher than those used in FIGURE 2 are used to indicate like elements. Again, a switching signal is coupled through transformer 55 to control transistors 56 and 57 which effect the operation of the switching transistor 52. The load 53 is made up of two portions 65, which may be the horizontal deflection yoke of a television receiver, and 66, which may be a high voltage power transformer. The collector of driving transistor 56 is connected through current limiting resistor 58 to a tap on the primary winding of transformer 66, at the proper impedance.

Transformer 66 is provided with two secondaries 66a and 66b, each of which are connected with rectifier and filter circuits, secondary 66a providing a high voltage for the ultor circuit of the cathode-ray tube and secondary 66b providing a potential for operating transistor 57 in the control circuit.

I claim:

1. A transistor switch circuit, comprising: a switching transistor; a load connected with said switching transistor and having a tap; a source of switching signal; a driving transistor connected between said source of switching signal and said switching transistor for rendering the switching transistor alternately conductive and non-conductive in accordance with the switching signal, said driver transistor being connected with the tap on said load, the current through the driving transistor passing through at least a portion of said load.

2. The transistor switch circuit of claim 1, wherein a resistor is provided in the connection between said driving transistor and the tap of said load.

3. In a television deflection system, a transistor switch, comprising: a switching transistor; a deflection coil connected with said switching transistor and having a tap; a source of switching signal; a driving transistor connected between said source of switching signal and said switching transistor for rendering the switching transistor alternately conductive and non-conductive, said driving transistor being connected with the tap on said deflection coil, the current through said driving transistor passing through a portion of the deflection coil.

4. A horizontal deflection circuit for a television receiver including a transistor switch circuit, comprising: a switching transistor; a load for said transistor comprising a horizontal deflection coil and the primary winding of a high voltage transformer, connected in parallel, and connected with said switching transistor; a source of switching signal; a driving transistor connected between said source of switching signal and switching transistor for rendering the switching transistor alternately conductive and non-conductive, said driving transistor being connected with a tap on one of the parallel branches of the load of said switching transistor, the current through said driving transistor passing through a portion of said branch of the load.

5. A transistor switch circuit for high current, comprising: a switching transistor having a control electrode and an output electrode with a load connected thereto; a source of switching signal connected with the control electrode of said switching transistor for rendering it alternately conductive and non-conductive; a second transistor having a control electrode connected with said source of switching signal and having a pair of controlled electrodes; and a circuit, having a resistance low with respect to the resistance of the circuit of the switching transistor, connecting said controlled electrodes of said second transistor directly across said switching transistor, said second transistor being rendered conductive by said switching signal when said switching transistor is rendered nonconductive, providing a low resistance shunt circuit draining stored carriers from said switching transistor during the non-conductive portion of the cycle thereof, the resistance of said connecting circuit when said second transistor is conductive being less than the resistance of said signal source.

6. A transistor switch circuit for high current, comprising: a switching transistor having a control electrode and a pair of controlled electrodes; a load connected with the circuit of the controlled electrodes of said switching transistor; a source of switching signal connected with the base of said switching transistor for rendering the controlled electrode circuit thereof alternately conductive and non-conductive; a second transistor having a control electrode connected wth said source of switching signal and having a pair of controlled electrodes; and a low resistance circuit connecting the controlled electrodes of the second transistor directly across the control electrode of said switching transistor, said second transistor being rendered conductive by said switching signal during the non-conductive period of the switching transistor, said low resistance circuit being characterized by an absence of lumped resistors providing a low resistance short circuit path for the control electrode of switching transistor, having a lower resistance than said signal source.

7. A transistor switch circuit for high current, comprising: a switching transistor having base, collector and emitter electrodes with a load connected in the collector-emitter circuit thereof; a source of switching signal connected with the base electrode of said switching transistor for rendering the collector-emitter circuit thereof alternately conductive and non-conductive; a second transistor having base, collector and emitter electrodes, with the base electrode connected to said source of switching signal; and a circuit having a resistance which is low with respect to the resistance of the base-emitter circuit of the switching transistor, when the switching transistor is nonconductive and characterized by an absence of lumped resistors, said circuit connecting the collector-emitter circuit of said second transistor directly with the base electrode of said switching transistor, said second transistor being rendered conductive by said switching signal during the non-conductive portion of the cycle of said switching transistor.

References Cited in the file of this patent

UNITED STATES PATENTS

| | | |
|---|---|---|
| 2,742,591 | Procter | Apr. 17, 1956 |
| 2,747,136 | Herzog | May 22, 1956 |
| 2,762,870 | Sziklai | Sept. 11, 1956 |
| 2,774,888 | Trousdale | Dec. 18, 1956 |
| 2,776,420 | Woll | Jan. 1, 1957 |
| 2,814,736 | Hamilton | Nov. 26, 1957 |
| 2,829,281 | Overbeek | Apr. 1, 1958 |
| 2,845,583 | Reuther et al. | July 29, 1958 |
| 2,848,653 | Hussey | Aug. 19, 1958 |
| 2,888,579 | Wanless | May 26, 1959 |
| 2,892,100 | Huang et al. | June 23, 1959 |
| 2,896,114 | Maloff | July 21, 1959 |
| 2,911,566 | Taylor | Nov. 3, 1959 |
| 2,913,625 | Finkelstein | Nov. 17, 1959 |
| 2,933,642 | Marley | Apr. 19, 1960 |
| 2,958,003 | Marshall | Oct. 25, 1960 |

OTHER REFERENCES

Transistor Circuit Engineering, by R. F. Shea, April 1957, pages 130 through 132.